(12) United States Patent
Weiss (10) Patent No.: US 7,714,578 B2
(45) Date of Patent: May 11, 2010

(54) OPTICAL DECOUPLING, TUNING AND SHIMMING OF MAGNETIC RESONANCE COILS

(75) Inventor: Steffen Weiss, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/817,985

(22) PCT Filed: Mar. 13, 2006

(86) PCT No.: PCT/IB2006/050779

§ 371 (c)(1),
(2), (4) Date: Sep. 7, 2007

(87) PCT Pub. No.: WO2006/097888

PCT Pub. Date: Sep. 21, 2006

(65) Prior Publication Data

US 2008/0157762 A1 Jul. 3, 2008

Related U.S. Application Data

(60) Provisional application No. 60/662,285, filed on Mar. 16, 2005.

(51) Int. Cl.
*G01V 3/00* (2006.01)
(52) U.S. Cl. .................................................. 324/318
(58) Field of Classification Search ......... 324/300–322; 333/219–235; 343/721
See application file for complete search history.

(56) References Cited

U.S. PATENT DOCUMENTS

| 4,694,255 A | 9/1987 | Hayes |
| 5,869,966 A | 2/1999 | Gatehouse |
| 2004/0019273 A1 | 1/2004 | Helfer et al. |
| 2004/0124838 A1* | 7/2004 | Duerk et al. ................. 324/304 |
| 2007/0043288 A1* | 2/2007 | Mueller ....................... 600/411 |

FOREIGN PATENT DOCUMENTS

WO 0175466 A1 10/2001

OTHER PUBLICATIONS

Eggers, H., et al.; Real-Time Incremental Difference Reconstruction for Visualization and Tracking of Switchable Catheters; 2001; Proc. Intl. Soc. Mag. Reson. Med.; 9; p. 2162.

(Continued)

*Primary Examiner*—Brij B Shrivastav
*Assistant Examiner*—Dixomara Vargas (57) ABSTRACT

A magnetic resonance imaging system (10) includes a transmit coil (22) and one or more receive coils (32). The transmit coil includes one or more circuit segments (44, 44, 80, 90) including a light-sensitive metal-insulator-semiconductor capacitor (50) which is connected by an optic fiber to one of a plurality of variable light sources (68). In the set-up mode, the transmit coil transmits RF pulses into an examination region (14). A plurality of the receive coils are disposed around the imaging region. The tuning processor (60) analyzes the received RF fields from around the imaging region and determines adjustments to the amount of light transmitted to each light-sensitive capacitor to shim or tune the transmit coil to optimize RF field homogeneity. Further, the receive coils (32) include a light-sensitive capacitor whose illumination is changed during RF transmission to detune the receive coil.

21 Claims, 7 Drawing Sheets

OTHER PUBLICATIONS

Kurpad, K. N., et al.; Implementation of coil integrated RF power MOSFET as voltage controlled current source in a transmit phased array coil; 2004; Proc. Intl. Soc. Mag. Reson. Med.; 11; p. 1585.

Malyshev, S. A., et al.; P-I-N Photodiodes for Optical Control of Microwave Circuits; 2004; IEEE J. of Selected Topics in Quantum Electronics; 10(4)679-685.

Vaughan, J. T., et al.; Efficient High-Frequency Body Coil for High-Field MRI; 2004; MRM; 52:851-859.

Weiss, S., et al.; MR-controlled fast optical switching of a resonant circuit mounted to the tip of a clinical catheter; 2001; Proc. Intl. Soc. Mag. Reson. Med.; 9; p. 544.

Zhang, X., et al.; An inverted-microstrip resonator for human head photon MR imaging at 7 Tesla; 2005; IEEE Trans. on Biomedical Engineering; 22(3)495-504.

* cited by examiner

OPTICAL DECOUPLING, TUNING AND SHIMMING OF MAGNETIC RESONANCE COILS

CROSS REFERENCE TO RELATED APPLICATIONS

This application claims the benefit of U.S. provisional application Ser. No. 60/662,285 filed Mar. 16, 2005, which is incorporated herein by reference.

BACKGROUND

The following relates to automated decoupling and tuning of radio frequency (RF) resonance coils. It finds particular application with coils that receive and/or transmit RF signals in magnetic resonance imaging, and will be described with particular reference thereto. However, it is to be appreciated that the invention may also find application in decoupling and tuning of signals in magnetic resonance spectroscopy and the like.

During the transmission and receipt of signals in a magnetic resonance environment, various techniques are employed to improve image quality. Such techniques include the decoupling/detuning of coils, noise adjustment of preamplifiers, mutual decoupling of coil elements, retuning for the purpose of multi nuclei operation, load dependent fine tuning of resonant frequencies, and radio frequency (RF) shimming of magnetic resonance coils. In magnetic resonance (MR), surface and local receive coils commonly use positive-intrinsic-negative (PIN) diodes for decoupling and coupling during transmission and reception, respectively. Typically, the PIN diode of the receive coil is biased such that the coil is detuned or decoupled from the resonance frequency during resonance excitation. For signal reception, the PIN diode is biased such that the surface coil is tuned to the resonance frequency. Other solid-state elements can also be used to switch between the tuned receive mode and the detuned mode.

This kind of detuning has several disadvantages. First, the detuning lines to surface coils are prone to electromagnetic interference. A significant problem is coupling of RF to these detuning lines during transmission. In high field systems, common mode RF resonances on these cables may cause local heating of the patient. As a result, the detuning lines are insulated for the relatively high reverse bias which adds to the bulkiness of the coil cable. Cable bulkiness problems are compounded in multi-element surface coil arrays. If the detuning lines of many surface coil elements are bundled in one cable, the forward currents add and may cause $B_0$ inhomogeneities. Moreover, the Lorentz force on the cable may be disturbing.

During manufacture, whole body and other coils are tuned to the Larmour frequency of the system. The tuning is accomplished by manually adjusting tunable capacitors distributed around the coil while loaded with an average patient in a standard position. In a bandpass birdcage type coil, for example, there is typically one or more adjustable capacitors in each of the 8 to 32 rods and a like number of adjustable capacitors in each end ring. Other whole body coils, such as SENSE coils, also have complex and time consuming tuning issues. Each capacitor is manually adjusted to tune the mode spectrum, a lengthy and costly iterative process. In addition, when a patient is introduced into the assembled scanner, the mode spectrum can change (e.g., by 400 kHz in a 3 T body coil) based on variation in the size and position of the patient. Due to the manual tuning process, it is not feasible to tune the whole body coil whose capacitors are in the interior of the scanner construction on a patient by patient basis.

For systems with field strength of 3 T and more, the wavelength of the RF within the patient is in the same order of magnitude as the spatial dimensions of the patient. This results in RF resonance effects within the patient leading to $B_1$ inhomogeneities. Moreover, the elliptic shape of a patient leads to different loads for different portions of the body coil resulting in additional $B_1$ inhomogeneity. It has been shown that these effects can be compensated by adjusting various distributed capacitors within a whole body coil or resonator. However, utilizing conventional manual means, most distributed capacitors within the whole body coil are not readily accessible for manual adjustment.

BRIEF SUMMARY

The present invention contemplates an improved apparatus and method that overcomes the aforementioned limitations and others.

According to one aspect, an RF coil assembly arrangement consisting of at least one coil segment utilizes magnetic resonance to image the patient. A coil segment has a circuit including a light-sensitive metal-insulator-semiconductor capacitor. An RF characteristic of the circuit is adjusted by adjusting a capacitance of the capacitor. An optical fiber is optically coupled to the capacitor. At least one light source adjusts the intensity of light supplied to the optic fiber to adjust the RF characteristic.

According to yet another aspect, an RF field optimizing processor is programmed to perform the steps of transmitting an RF signal into a subject disposed in a magnetic field with an RF coil assembly, receiving resonance signals from the subject analyzing the received signals for RF field homogeneity and tuning the RF coil assembly in accordance with the analysis. The tuning is done by adjusting light transmitted to a light sensitive MOS capacitor within a segment of the RF coil assembly.

One advantage of the present invention is that it facilitates fine tuning of RF coils on a patient by patient basis.

Another advantage of the present invention resides in the ability to fully automate RF coil tuning.

Another advantage is that lead lines are reduced in size and induced currents in the lead lines are avoided.

Yet another advantage resides in reducing manual labor during the manufacture of MRI scanners.

Numerous additional advantages and benefits will become apparent to those of ordinary skill in the art upon reading the following detailed description of the preferred embodiments.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
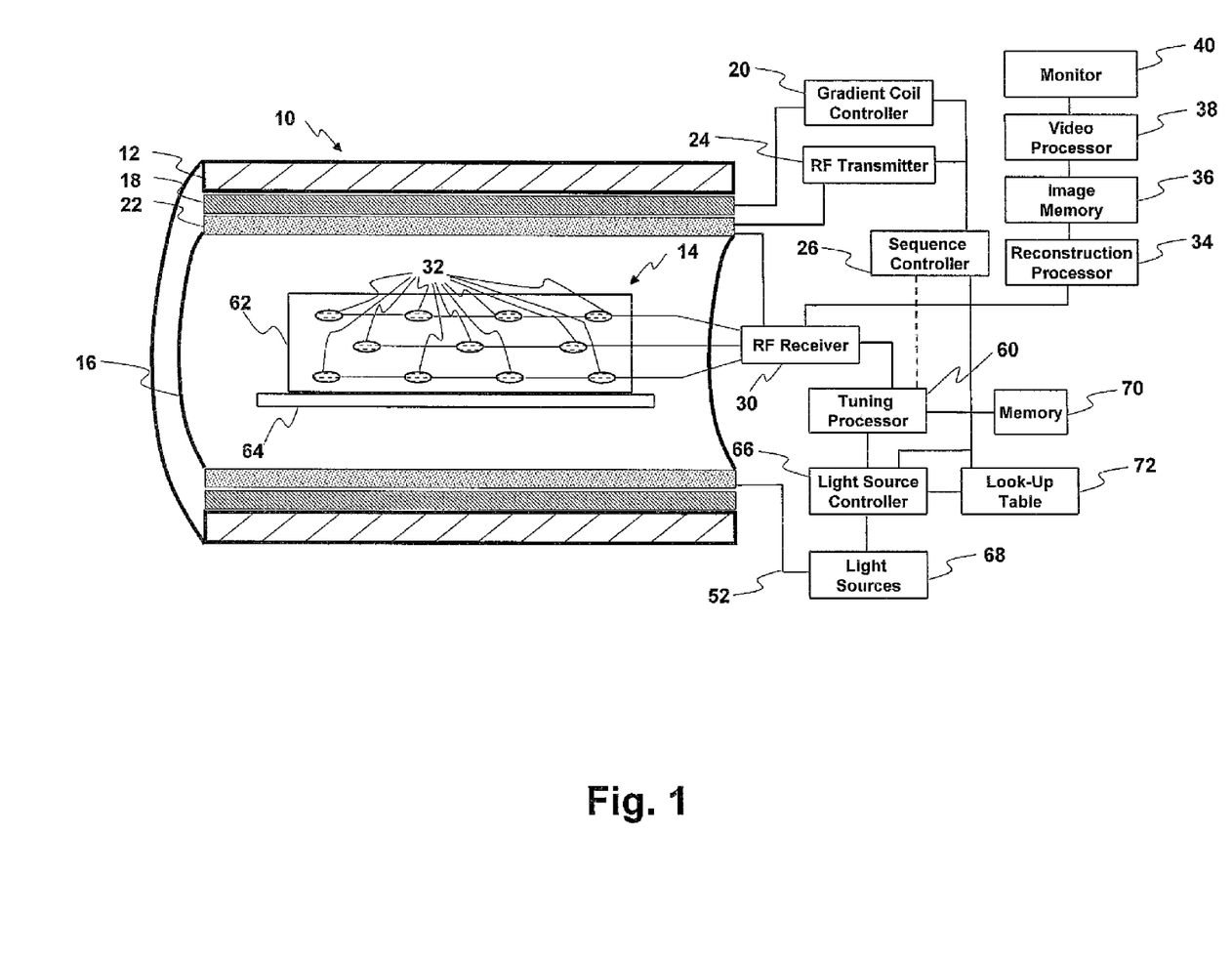
FIG. 1 illustrates a magnetic resonance system with an automated system for RF field shimming, fine tuning, retuning for multi-nuclei operation, and active decoupling.

A magnetic resonance (MR) scanner 10 includes a main field coil 12 for generating a substantially homogeneous, constant $B_0$ magnetic field through an imaging region 14, such as the bore 16 of a bore-type scanner. Although a bore-type scanner is illustrated, it is to be appreciated that the following discussion is also applicable to open and other types of magnetic resonance imagers. A gradient coil assembly 18 that contains one or more gradient coils and a gradient coil controller 20 selectively apply magnetic field gradients across the $B_0$ field. A whole-body RF coil assembly 22, in combination with an RF transmitter 24, generates $B_1$ radio frequency resonance excitation RF fields in the examination region 14. A sequence controller 26 controls the gradient coil controller 20 and the RF transmitter 24 to implement selected magnetic resonance and other sequences. In another embodiment, multiple surface transmit coils are employed to implement selected magnetic resonance.

The MR scanner 10 further includes a radio frequency (RF) receiver 30 which receives resonance signals picked-up either by the whole body radio frequency coil 22 or one or more local coils 32. The receiver demodulates the received resonance signals which are reconstructed by a reconstruction processor 34 to generate an image representation which is stored in an image memory 36. An operator selectively withdraws portions of the image representation from the image memory, which is converted by a video processor 38 into appropriate format for display on a monitor 40.

Figure 2:
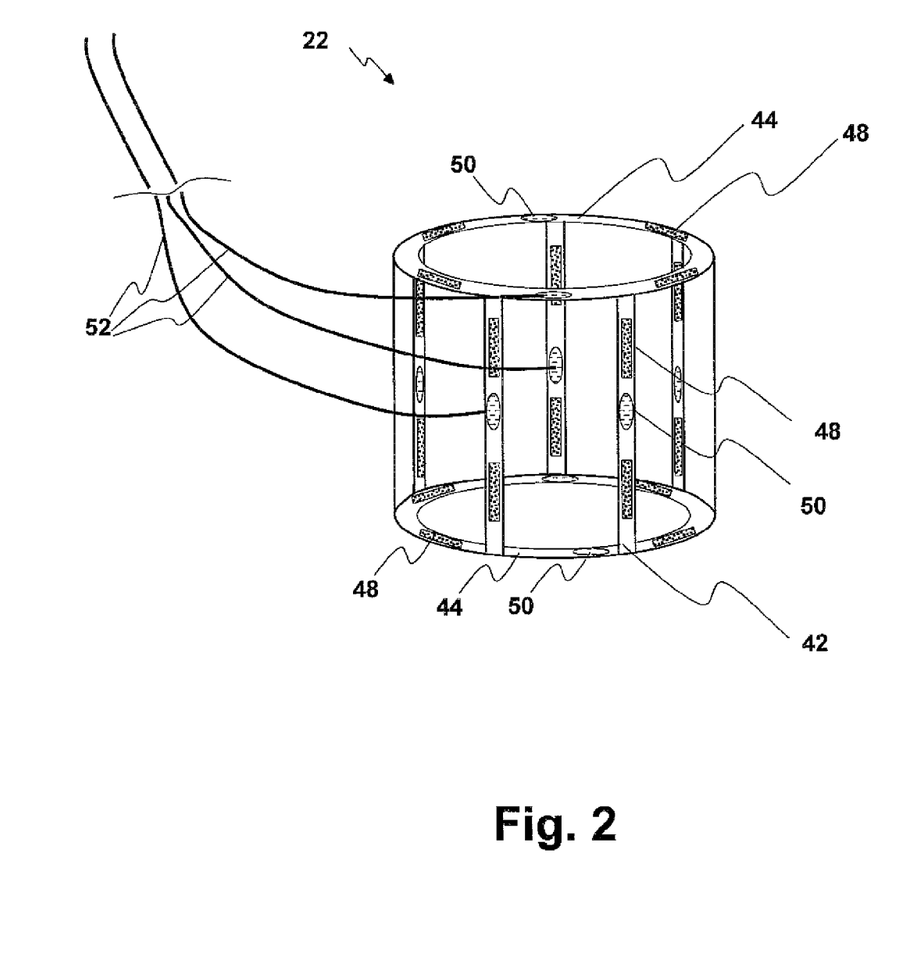
FIG. 2 illustrates a birdcage coil for use in the system of FIG. 1.

With reference to FIG. 2, an exemplary whole-body coil 22 is a birdcage coil which has a plurality of rungs 42 which extend between end rings 44. The rungs and end rings include fixed capacitors 48. Additionally, the rungs, end rings, or both include light tunable capacitors 50, whose capacitance is adjustable in accordance with the amount of light which each receives. Optical fibers 52 provide variable amounts of illumination to the light adjustable capacitors to adjust their capacitance.

With reference again to FIG. 1, a processor 60 determines the $B_1$ field characteristics throughout the examination region 14 after the subject has been introduced and determines the areas of the field to be modified. In one embodiment, the modifications provide a flat, spatial distribution of the radio frequency field. Thus, each metal-insulator-semiconductor capacitor acts as a radio frequency shim by varying the capacitance of each device. In this manner, the inhomogeneities of the $B_1$ field within the magnetic resonance scanner can be located and compensated. Other RF characteristics that are adjustable include resonance frequency, returning the resonance frequency for imaging two different nuclei, fine tuning, amplifier adjustment to reduce noise, detuning, and the like. The tuning processor tunes the light adjustable capacitors to optimize the radio frequency field for a nominal patient. A phantom 62 which simulates a nominal patient is supported on a patient support 64 in the examination region 14. Alternatively, the described process can be performed for each patient individually. The tuning processor 60 either directly or through the sequence controller 26 causes the RF transmitter 24 and the gradient coils to generate an RF or $B_1$ sensitive pulse sequence. The whole-body coil 22 receives the MR signal which is processed by the RF receiver 32. The tuning processor 60 or the reconstruction processor analyzes the received resonance signals to determine an RF field map. The tuning processor 60 controls a light source controller 66 to adjust the amount of light provided by light sources 68 to the fiber optics 52, hence the amount of light supplied to each of the light adjustable capacitors 50.

Various tuning algorithms are contemplated. For example, the tuning processor can be connected with a memory 70 which stores the nominal adjustments for preceding calibrated RF coils. The tuning processor 60 uses any of the commonly available optimization or difference minimization algorithms to iteratively adjust the light tunable capacitors 50 until a preselected degree of RF uniformity is achieved. Once the preselected level of RF field uniformity is achieved, the appropriate settings for each of the light sensitive capacitors 50 are stored in a look-up table 72 for use each time the scanner images a nominal subject. Optionally, this calibration process is repeated for a family of phantoms which simulate a small patient, a very large patient, nominal loading for legs, nominal loading for head imaging, and the like. The family of adjustments is stored in the look-up table 72 for use when imaging the corresponding sized patient and patient part. Although a birdcage type RF coil is illustrated, it is to be appreciated that the same calibration and tuning principles apply to other types of RF transmit coils.

Figure 3:
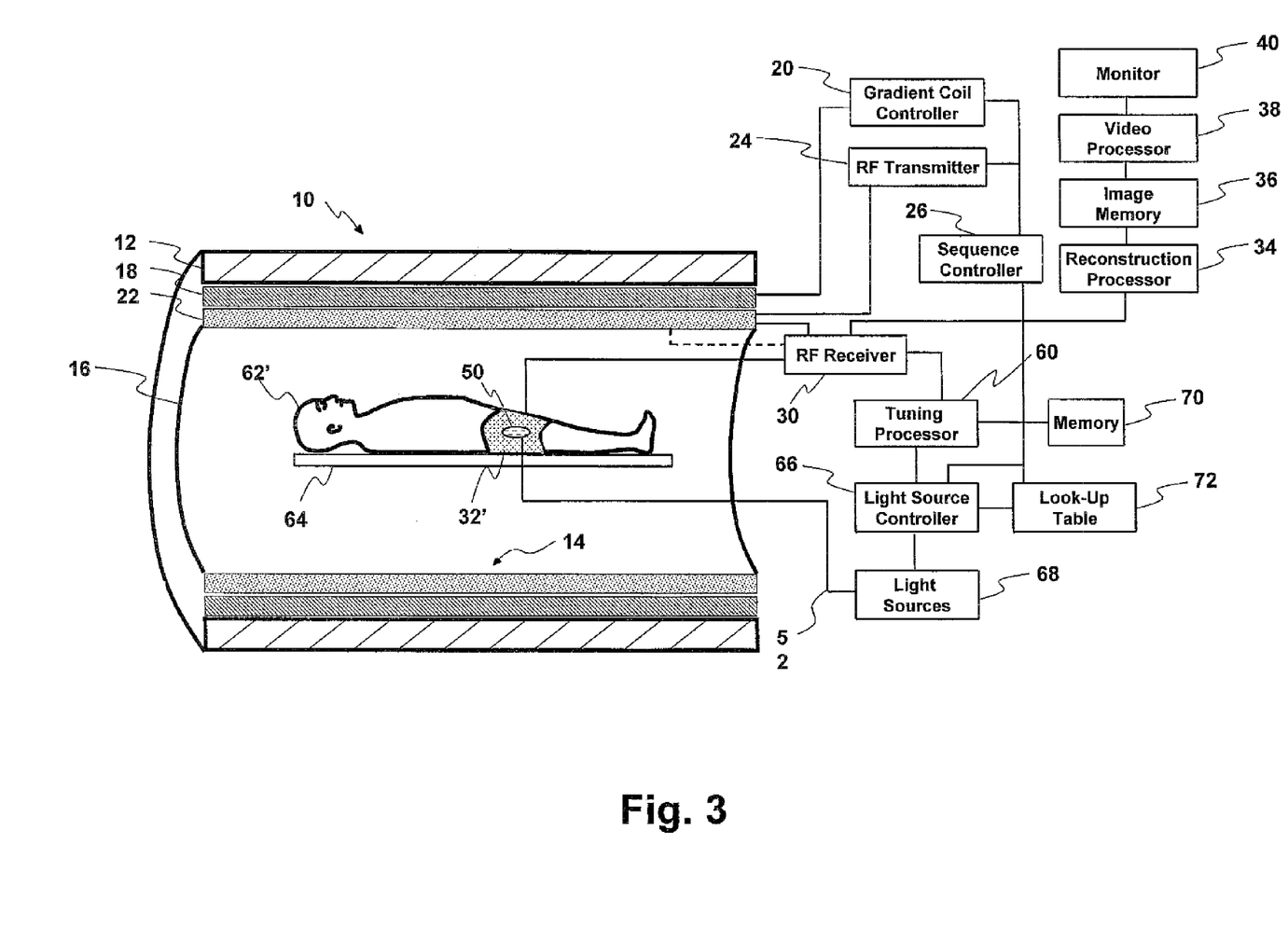
FIG. 3 illustrates a magnetic resonance imaging system during a patient examination.

The calibration process is typically done at the manufacturing site or by a technician at the customer site during a comprehensive calibration process. Particularly at higher $B_0$ field strengths, the portion of the patient to be imaged and the size of the patient have a sufficiently large adverse affect on the $B_1$ field that image quality can be improved by shimming or adjusting the RF transmit coil to compensation for the patient induced adverse affects on the $B_1$ field. Referring to FIG. 3, in which like components with FIG. 1 are denoted with the same reference numeral, a patient or subject 62' supported on the patient support 64 is positioned with a patient region to be examined in the examination region 14. The look-up table 72 is accessed and the preselected capacitance illumination values that were determined during the manufacturing processed are retrieved. Using this tuning of the coil, the tuning processor again causes a $B_1$ sensitive sequence to be conducted. Based on resonance signals received by the local coil 32 or the whole-body coil 22, the tuning processor determines deviation between the induced $B_1$ field and preselected $B_1$ field requirements. Based on these deviations, the tuning processor 60 determines adjustments to the values from the look-up table 72 to bring the actual $B_1$ field up to the preselected standards. This $B_1$ field optimization process can be carried out by retrieving a succession of the precalculated values from the look-up table 72 to find the closest adjustments and interpolating between them as necessary to optimize the $B_1$ field. Alternately, a conventional iterative difference minimization program can be utilized. The determined illumination or capacitance values are then used during the subsequent magnetic resonance imaging examination which is performed under the control of the sequence controller while the tuning processor 60 is quiescent.

After the transmit coil 22 is tuned, a magnetic resonance imaging session is conducted. When a local coil, such as surface coil 32' is used as the receive coil, the local coil is detuned during transmit. In the preferred embodiment, the sequence controller 26 controls the light sources 68 to change the illumination of detuning photocapacitors 50 on the receive coil.

Figure 4:
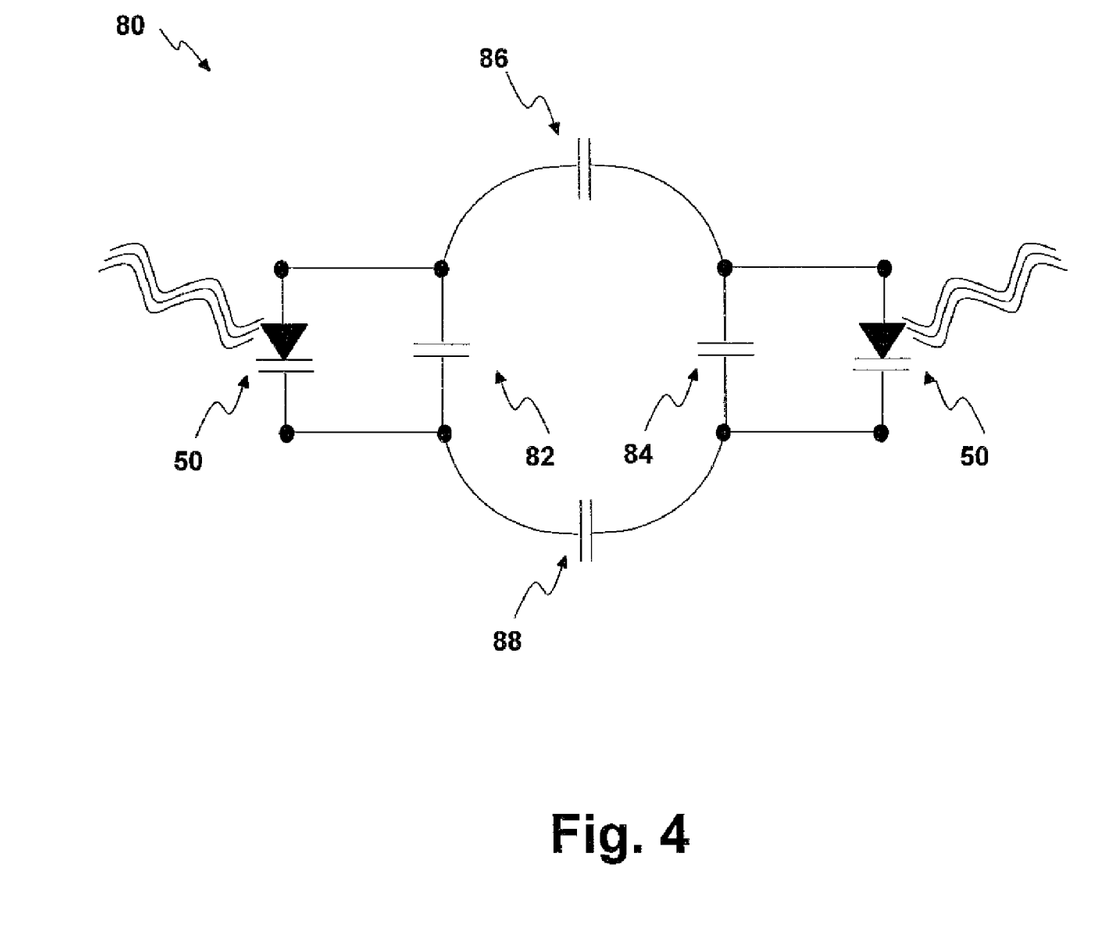
FIG. 4 shows an exemplary circuit diagram for tuning or detuning the surface coil of FIG. 3.

With reference to FIG. 4, an exemplary resonance circuit 80 includes two metal-inductor-semiconductors 50 employed to decouple a local receive coil. The metal-inductor-semiconductors 50 are connected in parallel to two split capacitors 82 and 84 within an RF receive device such as a surface coil, for example. Upon illumination, the metal-inductor-semiconductors 50 increase their capacitance thereby detuning the surface coil. Each metal-inductor-semiconductor 50 has a relative tuning range of about forty percent and a Q of about 50. In a preferred embodiment, the metal-inductor-semiconductors 50 are used in parallel with the fixed capacitor 82, 84 in order to achieve a higher Q for the circuit 80. By applying metal-inductor-semiconductors across split capacitors 86 and 88, the tuning range of the surface coil can be increased. For example, if capacitors 82-88 are 20 pF with Q=3000 and metal-inductor-semiconductors each have a range of capacitance from 7.1 pF (in a dark state) to 9.9 pF (in an illuminated state) and Q=50 each. The overall capacitance can be changed 10%, (e.g., a relative range of the resonance frequency of about 5%). In this approach, the resulting Q of the overall capacitance is 180 in the tuned state. The Q of a loaded surface coil is about 50 at 1.5 T. Therefore, in this example, decoupling is achieved via a frequency shift of five percent to provide detuning by 2.5 times the bandwidth.

Figure 5:
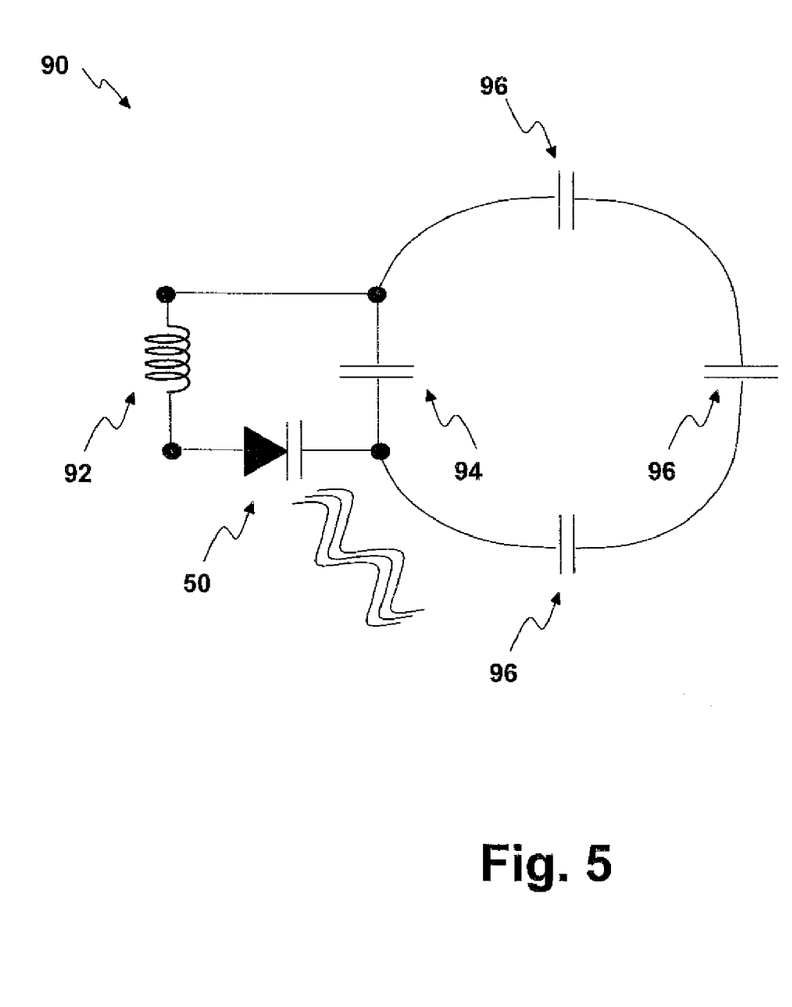
FIG. 5 shows another exemplary circuit diagram for detuning a surface coil of FIG. 3.

In FIG. 5, an alternative circuit 90 to detune a receive coil is shown. The metal-inductor-semiconductor 50 is part of a resonant circuit. The inductance of an inductor 92 and a capacitor 94 are chosen such that the circuit becomes resonant at Larmour frequency when the metal-inductor-semiconductor 50 is illuminated. Capacitors 96 are connected in series with one another and in parallel with capacitor 94. In this manner, the high impedance circuit decouples the surface coil. During signal reception, as the capacitance of the dark metal-inductor-semiconductor 50 decreases, the blocking circuit is detuned and no longer blocks the surface coil.

Figure 6:
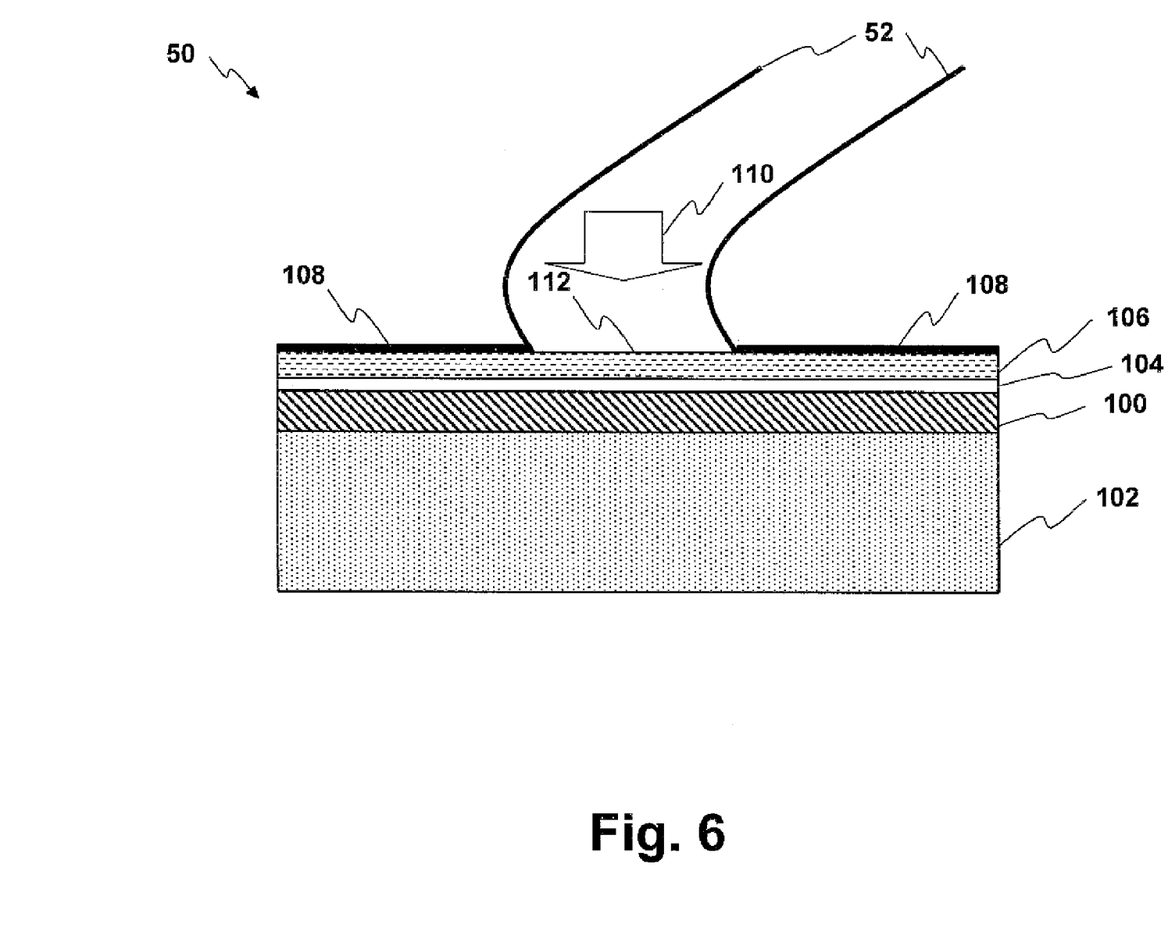
FIG. 6 shows a layer structure of a preferred light sensitive metal-insulator-semiconductor device in accordance with the present invention; and, FIG. 7 diagrammatically illustrates a capacitance-voltage-light characteristic of the light sensitive metal-insulator-semiconductor device in accordance with the present invention.

With reference to FIG. 6, in the preferred embodiment, the light adjustable capacitors 50 are each a metal-insulator-semiconductor capacitor. A lightly doped silicon layer 100 is disposed over highly doped substrate 102. The doping of the more lightly doped silicon layer 100 can be introduced during epitaxial growth or by subsequent processing, such as by ion implantation.

The disposition of the more lightly doped substrate 100 over the highly doped substrate 102 provides minimal losses in the outer connection due to high doping and, therefore, achieves a high quality factor (Q) for the capacitance. A thin insulating layer 104 is disposed over the more lightly doped substrate 100. A field electrode 106 covers the insulating layer 104 and a metal conductor 108 is disposed over the field electrode 106. In this particular embodiment, the insulating layer 104 is an optically transmissive oxide layer. The field electrode 106 is preferably made from polycrystalline silicon (e.g., less than 0.5 μm thick) or from a thin conducting oxide sufficiently transparent to visible and/or infrared light to let a majority of the incident light 110 pass through an aperture 112 into the more lightly doped substrate 100 below.

Figure 7:
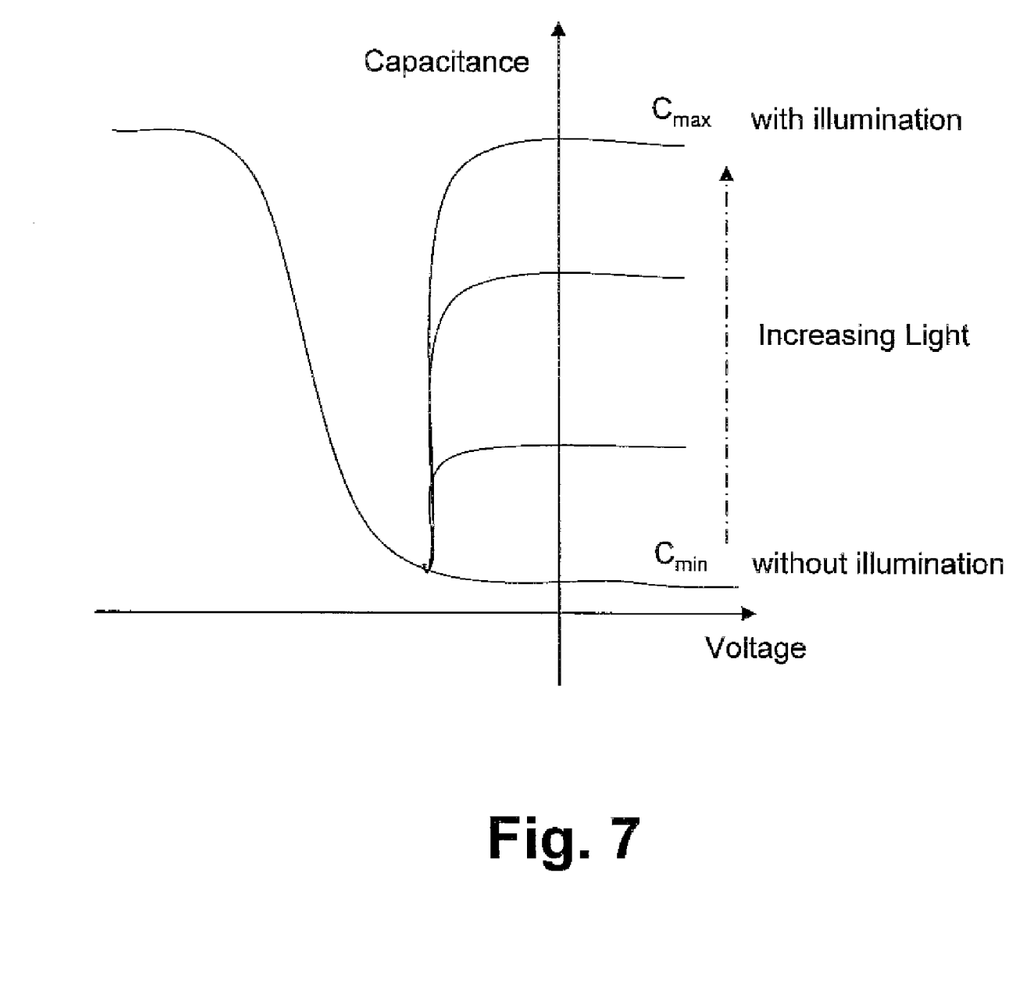

In the more lightly doped substrate 100, electron-hole pairs are created and respective minority charge carriers drift towards an isolation-semiconductor interface thereby causing an increase of the capacitance toward a maximum insulation capacitance, $C_{max}$. In the design of the preferred metal-insulator-semiconductor capacitor 50, the interface starts at and within the thin insulating oxide 104, the potentials in the semiconductor (controlled by the doping level) and the material of the gate electrode (n-doped polysilicon) are determined, such that a pronounced space charge region builds up, but no inversion yet occurs (depletion case). As a result, without illumination, the capacitance becomes minimal ($C_{min}$, c.f. FIG. 7), since the small space charge capacitance is in series with the large and fixed insulation capacitance.

The capacitance of the metal-insulator-semiconductor capacitor 50 can be varied by light 110 incident from the top. The optic fibers 52 from the array of controlled light sources 68 are each connected to the aperture 112 of a corresponding photocapacitor 50. Preferably, the light sources are in the range of 650 nm to 900 nm. The rate of positive capacitance change of the metal-insulator-semiconductor capacitor 50 under illumination is determined by the net rate of optical generation of minority charge carriers, e.g., by the rise time and power of the light source, and by the loss rate due to recombination of the minority charge carriers. The optical power, which is required to drive the device through its full capacitance range is inversely proportional to this rise time. For example, for a 1 mW light power, a rate of 1 μs can be achieved. The rate of negative capacitance change having stopped or reduced illumination is determined only by this recombination and can therefore be determined within a wide range via the life time of the minority charge carriers in the semiconductor (0.1 μs to several ms). The overall optical tuning range of the metal-insulator-semiconductor capacitor 50 is typically 10%-50%.

The overall capacitance and capacitance range of the metal-insulator-semiconductor capacitor 50 is based on the surface area of the aperture 112 and/or metal contacts 108, the thickness of the insulation layer 104, the doping level of the semiconductor and the thickness of the active epitaxial layer 100. In one approach, surface areas of the aperture 112 and/or metal contacts 108 are below 10 mm² to achieve capacitances of 100 pF. With larger surface areas, higher capacitances can be reached.

The described light sensitive metal-insulator-semiconductor capacitor 50 is exemplary only. Those skilled in the art can construct other light sensitive metal-insulator-semiconductor and other capacitors having capacitance characteristics that are suitable for this application. For example, oxide layers 104, 106 can be replaced by a silicon oxynitride layer, a silicon nitride layer, or the like deposited by plasma deposition or another deposition technique. Similarly, an $n^+/n$ doped semiconductor structure can be substituted for the $p^+/p$ doped semiconductor structure 100, 102. A group III-group V compound semiconductor-based light sensitive metal-insulator-semiconductor capacitor such as a gallium arsenide-based light sensitive metal-insulator-semiconductor capacitor is also contemplated.

With continuing reference to FIG. 6 and with further reference to FIG. 7, the light sensitive metal-insulator-semiconductor capacitor has a capacitance versus voltage characteristic shown in FIG. 7. Under a dark condition, that is, without illumination, or in other words with illumination intensity equal to zero, a minimum capacitance $C_{min}$ labeled in FIG. 7 is obtained. With increasing illumination intensity, the capacitance increases, up to a maximum value $C_{max}$. The absolute values of the minimum capacitance $C_{min}$ and the maximum capacitance $C_{max}$ include a dependence upon the area of the aperture 112. An area of the generally square or round aperture 112 shown in FIG. 4 is suitably characterized by a linear side dimension of the aperture 112.

Preferably, the middle of the tunable resonant frequencies to which a resonant circuit is tunable is achieved when the optically adjustable capacitance 50 is intermediate between the minimum capacitance $C_{min}$ and the maximum capacitance $C_{max}$. In this arrangement, the tuned resonant frequency can be precisely adjusted to correspond to the magnetic resonance frequency spectrum of the imaged dipoles in the magnetic resonance imaging scanner 10 by making suitable precise adjustments to the illumination sources 68. Designing a resonant circuit so that an intermediate capacitance provides the tuned resonance frequency allows the tuned resonance frequency to be adjusted upward or downward to accommodate, patients of different mass and regions of interest with different mass. However, it is also contemplated to design a local coil such that the minimum capacitance $C_{min}$ corresponds to a selected resonance frequency, or to design the surface coil such that the maximum capacitance $C_{max}$ corresponds to a selected resonance frequency.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance imaging system including:
    a main magnet which establishes a main magnet field in an imaging region;
    at least one RF coil assembly including:
        a coil segment having at least one circuit including a light sensitive capacitor, an RF characteristic being adjusted by adjusting a capacitance of the light-sensitive capacitor,
        an optical fiber optically coupled to the light-sensitive capacitor, and
        at least one light source for supplying light of adjustable intensity to the optical fiber, such that the RF characteristic of the RF coil assembly is selectable;
    an RF transmitter connected to the RF coil assembly for generating resonance exciting and manipulating RF pulses to excite and manipulate resonance of dipoles in the imaging region;
    gradient coils which generate magnetic field gradients across the imaging region;
    a sequence controller for controlling the gradient coils and the RF transmitter;
    at least one RF receive coil disposed adjacent the imaging region;
    a receiver that receives resonance signals from the RF receive coil assembly;
    an RF field optimizing processor that optimizes the RF characteristics, the RF field optimizing processor programmed to perform the steps of:
        causing the RF transmitter to generate RF characteristic sensitive pulse sequences;
        analyzing the received resonance signals received by the receiver to determine the RF characteristics; and
        adjusting the at least one variable light source to adjust the RF characteristics.

2. The magnetic resonance system as set forth in claim 1, wherein the RF characteristics include one or more of: resonance frequency, RF field distribution, fine tuning, retuning for imaging different nuclei, and detuning.

3. The magnetic resonance system as set forth in claim 1, further including:
    one or more coil segments each including one or more light sensitive capacitors.

4. The magnetic resonance system as set forth in claim 3, further including:
    receive coils for receiving RF signals in response to RF transmissions from the coil assembly;
    a processor which analyzes the received RF signals to determine the RF characteristics and determines capacitive adjustments for the coil segment circuits; and
    a light source controller connected with the processor to control the at least one variable light source to adjust the capacitance of the one or more light sensitive capacitors.

5. The magnetic resonance system as set forth in claim 1, wherein the light sensitive capacitor is a metal insulator semiconductor capacitor.

6. The magnetic resonance system as set forth in claim 5, wherein the light sensitive metal-insulator-semiconductor capacitor is a silicon based metal oxide semiconductor (MOS) device.

7. The magnetic resonance system as set forth in claim 5, wherein the light sensitive metal-insulator-semiconductor capacitor includes:
    a heavily doped semiconductor substrate;
    a more lightly doped semiconductor layer disposed over the heavily doped semiconductor substrate;
    an insulator layer disposed over the more lightly doped semiconductor layer; and
    a light transmissive conductive layer disposed over the insulator layer.

8. The magnetic resonance system as set forth in claim 7, wherein the capacitance of the metal-insulator-semiconductor capacitor is determined by at least one of surface area of the device, thickness of the insulator layer, and doping level, and thickness of the more lightly doped semiconductor layer.

9. The magnetic resonance imaging system as set forth in claim 1 wherein each RF receive coil includes at least one resonance circuit tuned to a preselected resonance frequency including a light-sensitive capacitor connected by an optical fiber to a variable light source controlled by a light source controller, the sequence controller being connected to the light source controller to detune the RF receive coil resonant circuit when the RF transmitter and the RF coil assembly are transmitting.

10. An RF coil assembly arrangement for magnetic resonance imagine, the coil including:
    a coil segment having at least one circuit including a preamplifier, a matching network, and at least one light sensitive capacitor, an RF characteristic being adjusted by adjusting a capacitance of the light-sensitive capacitor;
    an optical fiber optically coupled to the light-sensitive capacitor; and
    at least one light source for supplying light of adjustable intensity to the optical fiber, such that the RF characteristic is selectable, the intensity of the light delivered to the light sensitive capacitor being selected to provide noise matching.

11. The magnetic resonance system as set forth in claim 10, wherein the light sensitive capacitor includes:
    one of an n-n+ doped semiconductor layer structure and a p-p+ doped semiconductor layer structure configured to maximize a quality factor of the resonant circuit at the tuned resonance frequency.

12. An RF coil assembly arrangement for magnetic resonance imaging, the coil including:
    a plurality of coil segments having at least one circuit including one or more light sensitive capacitors located between the coil segments for the purpose of mutual decoupling of the coil segments;

an optical fiber optically coupled to the light-sensitive capacitor; and at least one light source for supplying light of adjustable intensity to the optical fiber, such that the capacitance of the one or more light sensitive capacitors is automatically adjusted to achieve said decoupling.

13. The RF coil assembly as set forth in claim 12 wherein the plurality of coil segments define a receive coil, changing the light intensity being effective to selectively tune and detune the receive coil.

14. An RF field optimizing system comprising:
an RF coil assembly;
a light sensitive metal insulator semiconductor capacitor within a coil segment of the RF coil assembly;
a light emitter; and
a processor programmed to perform the steps of:
(a) causing the RF coil assembly to transmit an RF signal into the imaging region;
(b) receiving resonance signals from the imaging region;
(c) analyzing the received signals for an RF characteristic; and
(d) control the light emitter to adjust light transmitted to the light sensitive metal insulator semiconductor capacitor to tune the RF coil assembly in accordance with the analysis to improve the RF characteristic.

15. A method of optimizing RF field homogeneity in a magnetic resonance imaging region, the method comprising:
(a) transmitting an RF signal into an imaging region of a subject disposed in a magnetic field (B0) with an RF coil assembly to induce resonance signals in tissue in the imaging region;
(b) receiving the induced resonance signals from the tissue in the imaging region;
(c) analyzing the received signals for RF field homogeneity; and
(d) tuning the RF coil assembly in accordance with the analysis to improve the RF field homogeneity by adjusting light transmitted by a light emitter to a light sensitive capacitor within a circuit segment of the RF coil assembly to tune the RF coil assembly in accordance with the analysis to improve the RF field homogeneity.

16. The method as set forth in claim 15 further including:
performing steps (a)-(d) with a subject or phantom of selected size to calibrate the RF coil assembly;
recording calibration settings for use in subsequent imaging procedures.

17. The method as set forth in claim 15, wherein receiving the resonance signals includes receiving the resonance signals with receive coils that includes light sensitive capacitors, and further including:
changing illumination provided to light sensitive capacitors to detune the receive coils during the transmitting of the RF signals.

18. The method as set forth in claim 15 further including:
performing steps (a)-(d) for each of a plurality of subjects of phantoms of preselected size;
recording calibration settings for each size phantom or subject;
in subsequent imaging procedures selecting among the calibration settings in accordance with a size of an imaged subject.

19. The method as set forth in claim 15 further including:
prior to imaging each patient, repeating steps (a)-(d) to optimize the RF characteristics to the imaged patient.

20. The method according to claim 19 further including:
repeating steps (a)-(d) during an imaging sequence.

21. A magnetic resonance imaging apparatus including a processor programmed to perform the method of claim 15.

* * * * *